United States Patent [19]

Leszyk

[11] 4,333,998
[45] Jun. 8, 1982

[54] RADIATION-CURABLE COMPOSITION FOR RESTORATIVE AND/OR PROTECTIVE TREATMENT OF PHOTOGRAPHIC ELEMENTS

[75] Inventor: Gerald M. Leszyk, Spencerport, N.Y.

[73] Assignee: Eastman Kodak Company, Rochester, N.Y.

[21] Appl. No.: 209,799

[22] Filed: Nov. 24, 1980

[51] Int. Cl.$^3$ .................. G03C 1/76; G03C 5/26
[52] U.S. Cl. .................. 430/12; 204/159.13; 204/159.16; 204/159.19; 252/600; 430/18; 430/140; 430/432; 430/463; 430/523; 430/531; 430/532; 430/535; 430/536; 430/272; 430/284; 430/449; 430/906; 430/938; 430/961
[58] Field of Search .................. 430/9, 284, 272, 12, 430/18, 273, 331, 328, 140, 432, 463, 523, 531, 532, 536, 535, 537, 906, 938, 961, 449; 204/159.19, 159.16, 159.13; 252/600

[56] References Cited

U.S. PATENT DOCUMENTS

| | | | |
|---|---|---|---|
| 4,082,634 | 4/1978 | Chang | 430/906 |
| 4,092,173 | 5/1978 | Novak et al. | 96/119 R |
| 4,130,708 | 12/1978 | Friedlander et al. | 528/28 |
| 4,171,979 | 10/1979 | Novak et al. | 96/119 R |
| 4,248,958 | 2/1981 | Faust | 430/906 |

OTHER PUBLICATIONS

Dow Corning Corporation product bulletin entitled, "Information About Silicone Surfactants For Urethanes," Aug. 1968.
Dow Corning Corporation product bulletin entitled, "Organo-functional Silicone Fluids—Silicone Polycarbinols".

*Primary Examiner*—Mary F. Downey
*Attorney, Agent, or Firm*—A. P. Lorenzo

[57] ABSTRACT

Radiation-curable compositions useful for restorative and/or protective treatment of photographic elements are comprised of an acrylated urethane, an aliphatic ethylenically-unsaturated carboxylic acid, a multifunctional acrylate, and a siloxy-containing polycarbinol. Photographic elements, such as still films, motion picture films, paper prints, microfiche, and the like, are provided with a protective overcoat layer which is permanently bonded to the element, and serves to protect it from abrasion and scratches, by coating the element with the radiation-curable composition and irradiating the coating to bond it to the element and cure it to form a transparent, flexible, scratch-resistant, crosslinked polymeric layer. The protective overcoat layer can be applied to the image-bearing side of the element or to the support side of the element or to both sides. The radiation-curable composition can also be used as a restorative composition in the treatment of photographic elements which have scratches, abrasion marks, and the like, which impair the appearance or projection capabilities of the element. In use as a restorative composition, the radiation-curable composition can be applied locally in the region of the defects only, to effectively eliminate them and restore the element to a substantially defect-free condition, or it can be applied over the entire surface of the element to both eliminate the defects and form a protective overcoat layer that is capable of providing protection against subsequent scratching or abrasion.

38 Claims, No Drawings

RADIATION-CURABLE COMPOSITION FOR RESTORATIVE AND/OR PROTECTIVE TREATMENT OF PHOTOGRAPHIC ELEMENTS

FIELD OF THE INVENTION

This invention relates in general to photography and in particular to compositions for restorative and/or protective treatment of photographic elements. More specifically, this invention relates to photographic elements, such as still film, motion picture films, paper prints, microfiche, and the like, to which a radiation-curable composition has been applied to eliminate defects, such as scratches, abrasion marks, and the like, which impair its appearance or projection capabilities, and/or to provide a protective overcoat layer that is capable of providing protection against subsequent scratching or abrasion.

BACKGROUND OF THE INVENTION

Photographic elements having protective overcoat layers are well known and a wide variety of different coating compositions have been proposed in the past for use as protective overcoats. Such overcoats serve a number of different purposes, such as to provide protection against fingerprints, abrasion and scratching, to protect against water spotting, to provide a particular surface texture such as a matte surface, to provide protection against blocking, and to act as anti-reflection layers which reduce glare. Layers of a temporary nature which are intended to be removed after they have served their purpose and layers which are permanently bonded to the photographic element have been described in the prior art. Protective overcoats can be applied to photographic elements by coating solutions or dispersions of film-forming agents in organic solvents such as are described, for example, in U.S. Pat. Nos. 2,259,009; 2,331,746; 2,706,686; 3,113,867; 3,190,197 and 3,415,670; by coating of aqueous film-forming compositions such as are described, for example, in U.S. Pat. Nos. 2,173,480; 2,798,004; 3,502,501 and 3,733,293; by coating of compositions containing discrete, transparent, solid particles of submicroscopic size as described in U.S. Pat. No. 2,536,764; by coating of plasticized polymer compositions as described in U.S. Pat. No. 3,443,946; by coating of polymerized perfluorinated olefins as described in U.S. Pat. No. 3,617,354; and by lamination of a protective layer as described, for example, in U.S. Pat. Nos. 3,397,980 and 3,697,277.

Many of the compositions used in the past to form protective overcoats on photographic elements have suffered from disadvantages which have greatly limited their usefulness. For example, it has been particularly difficult to formulate compositions which are fully satisfactory in providing abrasion and scratch resistance for photographic elements which are commonly subjected to severe conditions in handling and use, such as microfiche and motion picture films. Protective overcoats for such elements must meet exacting requirements with respect to factors such as transparency and flexibility as well as abrasion resistance and scratch resistance, and must be very strongly bonded to the underlying material to avoid the possibility of delamination.

An effective solution to the problem of providing useful protective overcoats for photographic elements, such as microfiche and motion picture films, which are subject to severe conditions of use, is disclosed in U.S. Pat. No. 4,092,173, "Photographic Elements Coated With Protective Overcoats," C. P. Novak, E. D. Morrison and G. M. Leszyk, issued May 30, 1978. As described in this patent, protective overcoats are formed on photographic elements by coating the element with a radiation-curable composition, comprising an acrylated urethane, an aliphatic ethylenically-unsaturated carboxylic acid and a multifunctional acrylate, and irradiating the coating to bond it to the element and cure it to form a transparent, flexible, scratch-resistant, cross-linked polymeric layer. The protective overcoat layer can be applied to the image-bearing side of the element or to the support side of the element or to both sides. As further described in U.S. Pat. No. 4,171,979 "Method Of Treating Scratched Or Abraded Photographic Elements With Radiation-Curable Compositions Comprising An Acrylated Urethane, An Aliphatic Ethylenically-Unsaturated Carboxylic Acid And A Multifunctional Acrylate," C. P. Novak, E. D. Morrison and G. M. Leszyk, issued Oct. 23, 1979, the compositions of U.S. Pat. No. 4,092,173 are also useful as restorative compositions in the treatment of photographic elements, such as still films, motion picture films, paper prints, microfiche, and the like, which have defects such as scratches, abrasion marks, and the like, which impair the appearance or projection capabilities of the element. In use as a restorative composition, the radiation-curable composition can be applied locally in the region of the defects only, to effectively eliminate them and restore the element to a substantially defect-free condition, or it can be applied over the entire surface of the element to both eliminate the defects and form a protective overcoat layer that is capable of providing protection against subsequent scratching or abrasion.

The present invention is directed to the objective of providing an improved radiation-curable composition for use in providing protective overcoats on photographic elements in the manner described in U.S. Pat. No. 4,092,173 and/or for use as a restorative composition in the manner described in U.S. Pat. No. 4,171,979.

SUMMARY OF THE INVENTION

It has now been discovered that incorporation of a siloxy-containing polycarbinol in radiation-curable compositions comprising an acrylated urethane, an aliphatic ethylenically-unsaturated carboxylic acid and a multifunctional acrylate substantially improves their performance as compositions for forming protective overcoats on photographic elements and/or as restorative compositions for use in treating photographic elements which have defects such as scratches, abrasion marks, and the like. In particular, the siloxy-containing polycarbinols, and especially certain mixtures of siloxy-containing polycarbinols, have been found to provide improved wetting, leveling, and coating characteristics, to provide improved adhesion to the photographic element, and to provide improved hardness, increased scratch resistance, and reduced coefficient of friction.

DESCRIPTION OF THE PREFERRED EMBODIMENTS

The radiation-curable compositions described herein can be used to provide protective overcoats and/or to treat scratches, abrasion marks, and similar defects in many different types of photographic elements. For example, the photographic elements can be still films, motion picture films, paper prints, or microfiche. They can be black-and-white elements, color elements formed from a negative in a negative-positive process, or color elements formed directly by a reversal process. Radiation curing of the composition has been found, quite surprisingly, to provide strong bonding to all of these different types of photographic element without in any way adversely affecting the element itself. The photographic elements can comprise any of a wide variety of supports. Typical supports include cellulose nitrate film, cellulose acetate film, poly(vinyl acetal) film, polystyrene film, poly(ethylene terephthalate) film, polycarbonate film, glass, metal, paper, polymer-coated paper, and the like. The image-forming layer or layers of the element typically comprise a radiation-sensitive agent, e.g., silver halide, dispersed in a hydrophilic water-permeable colloid. Suitable hydrophilic vehicles include both naturally-occurring substances such as proteins, for example, gelatin, gelatin derivatives, cellulose derivatives, polysaccharides such as dextran, gum arabic, and the like, and synthetic polymeric substances such as water-soluble polyvinyl compounds like poly(vinylpyrrolidone), acrylamide polymers, and the like. A particularly common example of an image-forming layer is a gelatino/silver halide emulsion layer, and the compositions described herein provide excellent results in treating defects in and providing protective overcoats for such emulsion layers.

In a particular embodiment of the present invention, the protective overcoat is applied only to the image-bearing side of the photographic element. In a second embodiment of the present invention, the protective overcoat is applied only to the support side of the element. In a preferred embodiment of the present invention, the protective overcoat is applied to both sides of the element.

The restorative method of treatment described herein is especially advantageous with motion picture films. Thus, for example, motion picture print film often becomes badly scratched after it has been run through projectors many times. It must then be discarded even though other characteristics may still be acceptable. Use of the restorative coating compositions described herein is highly effective in alleviating scratches that would blemish the projected image, and thus the scratched film can be restored to useful service. The method of this invention is particularly effective with scratches on the support side, which is where scratches most frequently occur on motion picture film. However, the restorative coating compositions described herein will also provide significant improvement with regard to scratches on the image side if such scratches are not too deep.

The first essential ingredient in the radiation-curable compositions employed in the practice of this invention is an acrylated urethane. The acrylated urethane can be a monomer, oligomer or polymer, or mixtures thereof. The acrylated urethanes are well known materials which have been used heretofore in radiation-curable compositions. Materials of this type are described, for example, in U.S. Pat. Nos. 3,509,234; 3,600,539; 3,694,415; 3,719,638 and 3,775,377 and in British Pat. No. 1,321,372. The acrylated urethanes are readily cross-linked by application of suitable radiation and are particularly advantageous in the coating compositions of this invention in that they form a very hard and very abrasion-resistant material upon curing. In a preferred embodiment of the invention, the acrylated urethane is prepared by reaction of a diisocyanate, such as tolylene diisocyanate, with a saturated aliphatic diol, such as 1,4-butane diol or neopentylglycol, and then with an unsaturated alcohol, such as 2-hydroxyethyl acrylate.

The second essential ingredient of the radiation-curable compositon is an aliphatic ethylenically-unsaturated carboxylic acid. Acids of this type act as effective adhesion promoters in the compositions employed herein. Typical examples of this class of acids are acrylic acid, methacrylic acid, 3-chloro-2-methyl acrylic acid, 3-butenoic acid, 4-pentenoic acid, 2-hexenoic acid, and the like. Preferred acids are those of the formula:

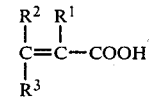

where $R^1$, $R^2$, and $R^3$ are hydrogen atoms or alkyl groups of 1 to 3 carbons atoms; while acrylic acid is especially preferred.

The third essential ingredient of the radiation-curable composition is a multifunctional acrylate, i.e., an acrylic monomer comprising at least two acrylic ester groups. Monomers of this class function in the radiation-curable compositions to increase hardness of the coating, improve adhesion and promote fast curing. Typical examples of this class of acrylic monomers are:
neopentylglycol diacrylate,
pentaerythritol triacrylate,
1,6-hexanediol diacrylate,
trimethylolpropane triacrylate,
tetraethylene glycol diacrylate,
1,3-butylene glycol diacrylate,
trimethylolpropane trimethacrylate,
1,3-butylene glycol dimethacrylate,
ethylene glycol dimethacrylate,
pentaerythritol tetraacrylate,
tetraethylene glycol diemethacrylate,
1,6-hexanediol dimethacrylate,
ethylene glycol diacrylate,
diethylene glycol diacrylate,
glycerol diacrylate,
glycerol triacrylate,
1,3-propanediol diacrylate,
1,3-propanediol dimethacrylate,
1,2,4-butanetriol trimethacrylate,
1,4-cyclohexanediol diacrylate,
1,4-cyclohexanediol dimethacrylate,
pentaerythritol diacrylate,
1,5-pentanediol dimethacrylate, and the like.
Preferred multifunctional acrylates are those of the formula:

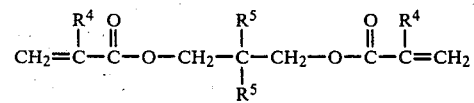

where each $R^4$ is independently selected from the group consisting of a hydrogen atom and an alkyl group of 1 to 2 carbon atoms, each $R^5$ is independently selected from the group consisting of an alkyl group of 1 to 6 carbon atoms and a radical of the formula:

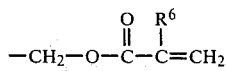

in which $R^6$ is a hydrogen atom or an alkyl group of 1 to 2 carbon atoms.

The fourth essential ingredient of the radiation-curable composition is a siloxy-containing polycarbinol. The siloxy-containing polycarbinols, which can also be described as organofunctional silicones having carbinol functionality, are well known materials. Examples of commercially available materials of this class include Dow Corning 193 Surfactant, Dow Corning 1248 Fluid, Dow Corning XF4-3557 Fluid, Dow Corning Q4-3667 Fluid and Dow Corning Q2-8026 Fluid, all of which are available from Dow Corning Corporation, Midland, Mich. These materials are polydimethylsiloxanes containing alcohol functional groups grafted onto the siloxane chain. Illustrative structural formulas of the siloxy-containing polycarbinols are as follows:

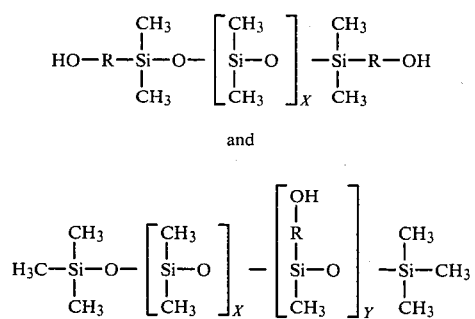

where R is a hydrocarbon radical, typically containing 1 to 10 carbon atoms, and X and Y are integers, typically having a value in the range of from 2 to about 100. The siloxy-containing polycarbinols are described in detail in U.S. Pat. No. 4,130,708, the disclosure of which is incorporated herein by reference.

As explained hereinabove, the radiation-curable compositions used in the practice of this invention are compositions containing (1) an acrylated urethane, (2) an aliphatic ethylenically-unsaturated carboxylic acid, (3) a multifunctional acrylate, and (4) a siloxy-containing polycarbinol. Mixtures of two or more acrylated urethanes, of two or more aliphatic ethylenically-unsaturated carboxylic acids, of two or more multifunctional acrylates, and of two or more siloxy-containing polycarbinols can be used, if desired, and may be advantageous in particular instances. Other ingredients can also be incorporated in the radiation-curable composition, for example, monoacrylates such as ethyl acrylate, butyl acrylate, 2-ethylhexylacrylate and hydroxypropyl acrylate can be used to modify the viscosity of the composition, and acrylamide can be used as an adhesion promoter. Other useful viscosity modifiers include solvents such as acetone or methanol.

The proportions of each of the four essential components of the radiation-curable coating composition can be varied widely, as desired. Typically, the acrylated urethane is used in an amount of from about 4 to about 60% of the total composition on a weight basis, the aliphatic ethylenically-unsaturated carboxylic acid is used in an amount of from about 1 to about 20% of the total composition on a weight basis, the multifunctional acrylate is used in an amount of from about 20 to about 95% of the total composition on a weight basis, and the siloxy-containing polycarbinol is used in an amount of from about 0.5 to about 8% of the total composition on a weight basis. The optimum amounts to use in a particular instance will depend upon the particular compounds involved and upon the characteristics of the photographic element which is being coated with the radiation-curable formulation. High concentrations of the aliphatic ethylenically-unsaturated carboxylic acid should usually be avoided in any coating composition which is to be in contact with a gelatin-containing layer of a photographic element, as they can adversely affect such layers since the acid may attack the gelatin. Particularly preferred compositions, in view of the excellent combination of transparency, hardness, scratch resistance, abrasion resistance, flexibility and adhesion achieved therewith, are compositions comprised of an acrylated urethane, acrylic acid, a siloxy-containing polycarbinol, trimethylolpropane triacrylate and neopentylglycol diacrylate or 1,6-hexanediol diacrylate. Use of the mixture of multifunctional acrylates, namely the combination of trimethylolpropane triacrylate and neopentylglycol diacrylate or 1,6-hexanediol diacrylate, is especially advantageous in that the trimethylolpropane triacrylate is particularly effective in providing good adhesion, and the neopentylglycol diacrylate or 1,6-hexanediol diacrylate is particularly effective as a hardening monomer which gives increased scratch resistance without sacrificing flexibility.

In the practice of this invention, the particular ingredients and proportion of ingredients in the coating composition that will provide the best results is dependent on the composition of the photographic element. For example, the particular coating compositions which will provide optimum adhesion depend on the particular binder used in the image-bearing layer(s) or, if the element is to be coated on the support side, the particular material used as a support. Generally speaking, it is much easier to obtain adequate adhesion to the support than to obtain adequate adhesion to the image-bearing layer(s). A few simple experiments may be found to be necessary to formulate an optimum coating composition for any particular photographic element.

The photographic elements which are protected with overcoat layers in accordance with this invention are processed to form a visible image prior to being coated on the image-bearing side with the radiation-curable composition. Such processing can be carried out in any suitable manner. For example, black-and-white elements are typically processed in a sequence of steps comprising developing, fixing and washing, color prints in a sequence comprising color developing, bleaching, fixing (or combined bleach-fixing) and stabilizing, and color reversal elements in a sequence comprising black-and-white negative development, followed by reversal exposure or fogging, color development, bleaching, fixing (or combined bleach-fixing) and stabilizing. An advantageous manner of utilizing the invention described herein is to modify the conventional photographic processing operation to include, as final steps in the process following drying of the element, the steps of coating and curing to form the protective overcoat. The coating and curing steps can be carried out in a batch, semi-continuous or continuous manner, as desired.

Coating of the photographic element with the radiation-curable composition can be carried out in any convenient manner. For example, it can be carried out by dip coating, air-knife coating, roll coating, gravure coating, extrusion coating, bead coating, curtain coating, use of wire wound coating rods, and so forth. Typically, the coating deposited on the element will be a very thin coating such as a wet coverage in the range from about 2 to about 20 cubic centimeters of coating composition per square meter of surface coated, more usually in the range from about 3 to about 10 cubic centimeters of coating composition per square meter, and preferably about 5 cubic centimeters of coating composition per square meter. The viscosity of the coating composition can vary widely, depending on the particular method of coating which is chosen. Typically, satisfactory coatings can be readily formed on photographic elements from coating compositions having a viscosity in the range from about 25 to about 1000 centipoises, and more preferably in the range from about 75 to about 200 centipoises.

In that aspect of the present invention which involves using the radiation-curable composition as a restorative composition, the photographic elements which are treated are elements which have been exposed and processed to form a visible image and which, during exposure or processing or more usually during subsequent use, have been abraded or scratched or otherwise treated in a manner to impart defects which impair their appearance or projection capabilities. While scratches or abrasion marks can be incurred in exposure and/or processing, the more typical situation is a gradual accumulation of such defects as a result of use of the element. Thus, the normal use of exposed and processed elements, for example, use of a motion picture film in a projector or of a microfiche in a reader, commonly results in the formation of the kinds of defects which can be removed or at least diminished by the method of this invention.

In using the radiation-curable composition as a restorative composition, it is applied to the photographic element at least in the region of the element in which the defects are located, and is thereafter cured. It can be applied only to such region, since local application to the defects by suitable means such as a brush, or other type of applicator can be utilized, if desired. It will usually be much easier and more convenient, since there will be many small scratches and abrasion marks on the photographic element, to apply the radiation-curable composition over the entire surface or surfaces of the element where the defects appear. In following the latter procedure, coating of the photographic element with the radiation-curable composition can be carried out in any convenient manner. For example, it can be carried out by any of the coating procedures described hereinabove.

The viscosity of the radiation-curable composition used to treat a scratched or abraded photographic element must be sufficiently low that it is able to fill in the scratch or other defect. In other words, the viscosity must not be so high that the composition applied bridges over a scratch with the result that the scratch will remain as a visible defect beneath the transparent cured polymeric material. The optimum viscosity will depend on numerous factors such as the type of element being treated, the method of application of the composition, and the width and depth of the scratch. Typically, viscosities in the range from about 5 to about 600 centipoises are useful for this purpose, with the preferred range being from about 10 to about 100 centipoises, and the most preferred range being from about 30 to about 40 centipoises.

Apparatus and methods for curing of radiation-curable compositions by subjecting them to suitable forms of radiation are well known, and any suitable radiation curing process can be used in carrying out this invention. For example, curing can be carried out by the application of ultraviolet radiation of suitable intensity. High energy ionizing radiation such as X-rays, gamma rays, beta rays and accelerated electrons can also be used to accomplish curing of the coating. Typically, the radiation used should be of a sufficient intensity to penetrate substantially all the way through the coated layer. The total dosage employed should be sufficient to bring about curing of the radiation-curable composition to form a solid plastic. Typically, dosages in the range of about 0.2 to about 50 megarads, more usually in the range from about 0.5 to about 20 megarads, are employed. The coating compositions used in this invention are substantially completely convertible to a solid product so that the removal of solvent or diluents during the curing step is not necessary. Furthermore, they undergo little or no shrinkage upon curing. Accordingly, when a scratch is completely filled in by the radiation-curable composition it remains completely filled in after the curing step is completed. While it is not necessary to employ solvents or diluents which are removed from the coating in the curing step, they can be employed if needed to modify the properties of the coating composition.

When the radiation-curable composition is cured by the use of ultraviolet radiation, a photoinitiator should be included in the composition. Many photoinitiators which are useful for such purpose are known to the art, for example, butyl benzoin ether, isobutyl benzoin ether, ethyl benzoin ether, benzophenone, benzoin, acetophenone dimethyl quinoxiline, 4,4'-bis(dimethylamino)benzophenone, and the like. Such photoinitiators may be used singly or in combination. The use of photoinitiators is not necessary when curing is carried out with high energy electrons.

Overcoating of photographic elements in the manner described herein can be advantageously carried out in appropriate cases prior to cutting the element to its final size. Thus, after the photographic element has been processed to a visible image and dried, it can be coated with the radiation-curable composition, then irradiated, and then cut to size. In some instances, it will be sufficient to coat the radiation-curable composition only on the side of the element bearing the image-containing layer(s) or only on the support side. In other instances, it will be desirable to coat the photographic element with radiation-curable composition on both sides. For example, motion picture films and microfiche will typically be coated on both sides in view of the very severe handling that such articles are subject to in ordinary use and the need to reduce to an absolute minimum the formation of scratches on such articles. Both sides of the element can be coated simultaneously or each side can be coated separately depending on the particular method used for coating.

The radiation-curable compositions described herein adhere strongly to both the image-bearing side and the support side of photographic elements, and, accordingly, are effective in providing protective overcoats, or in treating scratches, abrasion marks and other defects, on either or both of the image-bearing side and the support side. They are effective in providing adhesion to materials with which it is ordinarily difficult to achieve adhesion, such as the cellulose triacetate or poly(ethylene terephthalate) which are commonly used as support materials for photographic elements and the gelatino/silver halide emulsion layers or gelatin protective layers commonly employed on the image-bearing side of photographic elements. Irradiation of the composition to cure it to a transparent, flexible, scratch-resistant, cross-linked polymeric layer can be carried out with no significant detrimental effect on the image-bearing layer(s), even with color elements in which the images are dye images.

The invention includes within its scope elements which comprise a photographic support, an image-bearing layer and a protective overcoat layer and elements which do not include an image-bearing layer which are intended to be used in the subsequent preparation of elements having an image-bearing layer.

The invention is further illustrated by the following examples of its practice.

EXAMPLE 1

A radiation-curable coating composition was prepared as follows:

| Component | Weight % |
| --- | --- |
| Acrylated urethane resin[1] | 10.1 |
| Trimethylolpropane triacrylate | 31.2 |
| Neopentylglycol diacrylate | 42.4 |
| Acrylic acid | 9.6 |
| Fluorocarbon coating aid[2] | 0.2 |
| Methyldiethanol amine | 2.5 |
| Benzophenone | 4.0 |
| | 100.0 |

[1] The acrylated urethane resin had the following structure:

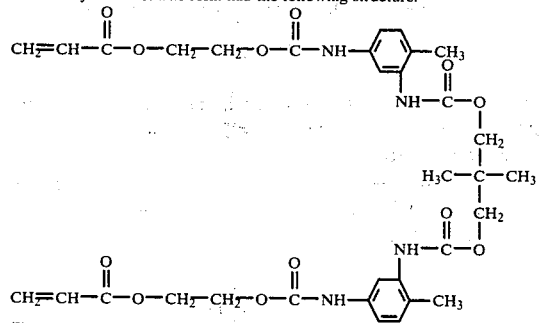

[2] The coating aid was Surfactant FC-430 from Minnesota Mining and Manufacturing Company.

A 35 mm color print motion picture film having a poly(ethylene terephthalate) support and gelatino/silver halide emulsion layers was exposed, processed, coated on both sides with the coating composition described above, and cured by passing it under a bank of three 200 watt/inch high intensity mercury vapor UV lamps at a distance of 12 inches. A sample of the coated film is referred to hereinafter as film sample A. Coating compositions B, C and D were also prepared, coated in the same manner on the same exposed and processed motion picture film, and cured in the same manner to provide film Samples B, C and D. These compositions were identical to composition A, except that composition B additionally contained 5 parts per hundred parts by weight of Dow Corning 193 Surfactant, composition C additionally contained 5 parts per hundred parts by weight of Dow Corning Fluid Q4-3667, and composition D additionally contained 5 parts per hundred parts by weight of a mixture of one part by weight Dow Corning 193 Surfactant and one part by weight Dow Corning Fluid Q4-3667.

The coated film samples were subjected to scratch resistance and coefficient of friction tests in accordance with procedures of the American National Standards Institute, Inc., 1430 Broadway, New York, N.Y., USA 10018. Specifically, the scratch resistance tests were carried out in accordance with ANSI Test Method PH1.37-1977 and the coefficient of friction tests were carried out in accordance with ANSI Test Method PH1.47-1972. For purposes of comparison, a sample of the uncoated film, referred to hereinafter as the control film, was tested in the same manner.

Results obtained are reported in Table I below. In regard to the light transmission data, higher values for light transmission are indicative of less haze under the test conditions and thus of greater scratch resistance. In regard to the data for the "single arm scratch" test, values reported are the load in grams required to form a scratch which is visible at the indicated projection distance, with higher values at a given projection distance being indicative of greater scratch resistance. The term "plow" refers to conditions under which the stylus of the test instrument "plows" its way through substantially the entire layer.

TABLE I

| | Light Transmission | Single Arm Scratch (grams) | | | Coefficient of Friction |
| --- | --- | --- | --- | --- | --- |
| | | Projected at 4 ft. | Projected at 15 ft. | Plow | |
| Control Film | | | | | |
| Emulsion side | 20 | 30 | 40 | 90 | 0.18 |
| Support side | 30 | 60 | 70 | >140 | 0.22 |
| Film Sample A | | | | | |
| Emulsion side | 20 | 40 | 50 | 60 | 0.28 |
| Support side | 40 | 90 | 100 | >140 | 0.28 |
| Film Sample B | | | | | |
| Emulsion side | 20 | 50 | 60 | 100 | 0.24 |
| Support side | 40 | 90 | 100 | >140 | 0.24 |
| Film Sample C | | | | | |
| Emulsion side | 20 | 60 | 65 | 115 | 0.14 |
| Support side | 70 | 110 | 120 | >140 | 0.14 |
| Film Sample D | | | | | |
| Emulsion side | 20 | 60 | 70 | 130 | 0.14 |
| Support side | 70 | 110 | 120 | >140 | 0.14 |

Use of Dow Corning Surfactant 193 in coating composition B provided substantial improvement in coatability as compared with composition A, i.e., the coating was much more uniform with considerably less tendency for cratering and the formation of blemishes to occur. Use of Dow Corning Fluid Q4-3667 in coating composition C provided a substantial improvement in scratch resistance and a substantial reduction in coefficient of friction. Use of both Dow Corning Surfactant 193 and Dow Corning Fluid Q4-3667 in coating composition D provided major improvements in regard to coatability, scratch resistance, and coefficient of friction.

EXAMPLE 2

A radiation-curable coating composition was prepared as follows:

| Component | Weight % |
| --- | --- |
| Acrylated urethane resin of Example 1 | 9.6 |
| Trimethylolpropane triacrylate | 29.7 |

-continued

| Component | Weight % |
|---|---|
| Neopentylglycol diacrylate | 35.6 |
| 1,6-Hexanediol diacrylate | 4.8 |
| Acrylic acid | 9.1 |
| Fluorocarbon coating aid of Example 1 | 0.2 |
| Siloxy-containing polycarbinol[(1)] | 4.8 |
| Methyldiethanol amine | 2.4 |
| Benzophenone | 3.8 |
| | 100.0 |

[(1)]A mixture of one part by weight Dow Corning 193 Surfactant and one part by weight Dow Corning Fluid Q4-3667.

The above-described coating composition was utilized as a protective overcoat for photographic film in the same manner described in Example 1 and gave similar good results.

The radiation-curable compositions described herein are highly effective in forming protective overcoat layers and in eliminating or reducing defects such as scratches, abrasion marks, and the like, in photographic elements. They have excellent wetting, leveling, and coating characteristics which facilitate their application to photographic elements. They adhere strongly to photographic elements and are easily cured with convenient and readily available radiation sources to form transparent, flexible and highly scratch resistant protective coatings.

The invention has been described in detail with particular reference to preferred embodiments thereof, but it will be understood that variations and modifications can be effected within the spirit and scope of the invention.

I claim:

1. A radiation-curable coating composition which is useful for the formation of protective overcoats on photographic elements, said composition comprising (1) an acrylated urethane, (2) an aliphatic ethylenically-unsaturated carboxylic acid, (3) a multifunctional acrylate, and (4) a siloxy-containing polycarbinol.

2. A radiation-curable coating composition as claimed in claim 1 wherein said acrylated urethane has the formula:

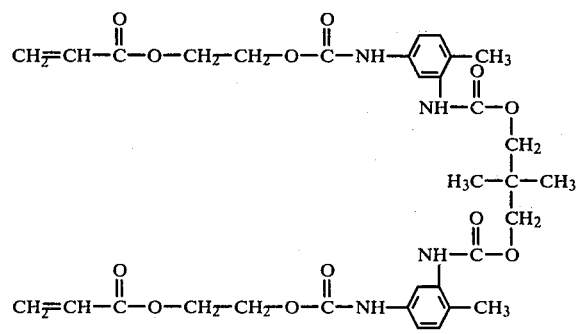

3. A radiation-curable coating composition as claimed in claim 1 wherein said aliphatic ethylenically-unsaturated carboxylic acid has the formula:

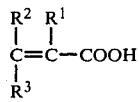

wherein $R^1$, $R^2$ and $R^3$ are independently selected from the group consisting of a hydrogen atom and an alkyl group of 1 to 3 carbon atoms.

4. A radiation-curable coating composition as claimed in claim 1 wherein said aliphatic ethylenically-unsaturated carboxylic acid is acrylic acid.

5. A radiation-curable coating composition as claimed in claim 1 wherein said multifunctional acrylate has the formula:

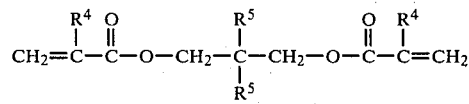

wherein each $R^4$ is independently selected from the group consisting of a hydrogen atom and an alkyl group of 1 to 2 carbon atoms, and each $R^5$ is independently selected from the group consisting of an alkyl group of 1 to 6 carbon atoms and a radical of the formula:

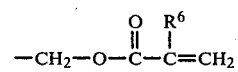

in which $R^6$ is a hydrogen atom or an alkyl group of 1 to 2 carbon atoms.

6. A radiation-curable coating composition as claimed in claim 1 wherein said siloxy-containing polycarbinol has the formula:

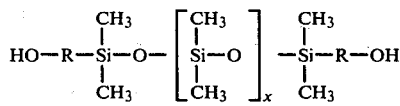

where R is a hydrocarbon radical containing 1 to 10 carbon atoms and x is an integer having a value in the range of from 2 to 100.

7. A radiation-curable coating composition as claimed in claim 1 wherein said siloxy-containing polycarbinol has the formula:

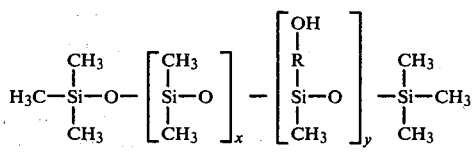

where R is a hydrocarbon radical containing 1 to 10 carbon atoms and x and y are integers having a value in the range of from 2 to 100.

8. A photographic element comprising
(1) a support,
(2) at least one image-bearing layer, and
(3) a protective overcoat layer which is permanently bonded to at least one side of said element, said protective overcoat layer having been formed by
(a) coating said element with a radiation-curable coating composition which forms a transparent, flexible, scratch-resistant, crosslinked polymeric layer upon radiation curing, said coating composition comprising (1) an acrylated urethane, (2) an aliphatic ethylenically-unsaturated carboxylic acid, (3) a multifunctional acrylate, and (4) a siloxy-containing polycarbinol, and (b) subjecting said coating to radiation sufficient to cure said coating and bond it to said element.

9. A photographic element comprising
(1) a support,
(2) at least one image-bearing layer, and
(3) a protective overcoat layer which is permanently bonded to the image-bearing side of said element; said protective overcoat layer having been formed by (a) coating said image-bearing side with a radiation-curable coating composition which forms a transparent, flexible, scratch-resistant, cross-linked polymeric layer upon radiation curing, said coating composition comprising (1) an acrylated urethane, (2) an aliphatic ethylenically-unsaturated carboxylic acid, (3) a multifunctional acrylate, and (4) a siloxy-containing polycarbinol, and (b) subjecting said coating to radiation sufficient to cure said coating and bond it to said image-bearing side.

10. A photographic element comprising
(1) a support,
(2) at least one image-bearing layer, and
(3) a protective overcoat layer which is permanently bonded to the support side of said element; said protective overcoat layer having been formed by (a) coating said support side with a radiation-curable coating composition which forms a transparent, flexible, scratch-resistant, cross-linked polymeric layer upon radiation curing, said coating composition comprising (1) an acrylated urethane, (2) an aliphatic ethylenically-unsaturated carboxylic acid, (3) a multifunctional acrylate, and (4) a siloxy-containing polycarbinol, and (b) subjecting said coating to radiation sufficient to cure said coating and bond it to said support side.

11. A photographic element comprising
(1) a support,
(2) at least one image-bearing layer, and
(3) protective overcoat layers which are permanently bonded to both the image-bearing side of said element and the support side of said element, each said protective overcoat layer having been formed by (a) coating the respective side with a radiation-curable coating composition which forms a transparent, flexible, scratch-resistant, cross-linked polymeric layer upon radiation curing, said coating composition comprising (1) an acrylated urethane, (2) an aliphatic ethylenically-unsaturated carboxylic acid, (3) a multifunctional acrylate, and (4) a siloxy-containing polycarbinol, and (b) subjecting said coating to radiation sufficient to cure it and bond it to the side of the element on which it is coated.

12. A photographic element comprising
(1) a support,
(2) at least one image-bearing layer, and (3) protective overcoat layers which are permanently bonded to both the image-bearing side of said element and the support side of said element, each said protective overcoat layer having been formed by (a) coating the respective side with a radiation-curable coating composition which forms a transparent, flexible, scratch-resistant, cross-linked polymeric layer upon radiation curing, said coating composition comprising (1) an acrylated urethane, (2) an aliphatic ethylenically-unsaturated carboxylic acid, (3) a multifunctional acrylate, (4) a siloxy-containing polycarbinol, and (5) a photoinitiator, and (b) subjecting said coating to ultraviolet radiation sufficient to cure it and bond it to the side of said element on which it is coated.

13. A photographic element as claimed in claim 8 wherein said aliphatic ethylenically-unsaturated carboxylic acid has the formula:

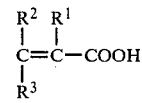

wherein $R^1$, $R^2$ and $R^3$ are independently selected from the group consisting of a hydrogen atom and an alkyl group of 1 to 3 carbon atoms.

14. A photographic element as claimed in claim 8 wherein said aliphatic ethylenically-unsaturated carboxylic acid is acrylic acid.

15. A photographic element as claimed in claim 8 wherein said multifunctional acrylate has the formula:

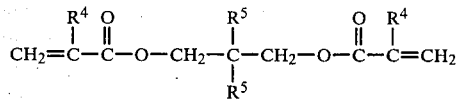

wherein each $R^4$ is independently selected from the group consisting of a hydrogen atom and an alkyl group of 1 to 2 carbon atoms, and each $R^5$ is independently selected from the group consisting of an alkyl group of 1 to 6 carbon atoms and a radical of the formula

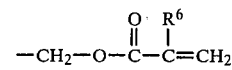

in which $R^6$ is a hydrogen atom or an alkyl group of 1 to 2 carbon atoms.

16. A photographic element as claimed in claim 8 wherein said multifunctional acrylate is trimethylolpropane triacrylate.

17. A photographic element as claimed in claim 8 wherein said multifunctional acrylate is pentaerythritol tetraacrylate.

18. A photographic element as claimed in claim 8 wherein said multifunctional acrylate is neopentylglycol diacrylate.

19. A photographic element as claimed in claim 8 wherein said support is a cellulose triacetate support and said image-bearing layer is an imagewise-exposed and processed gelatino/silver halide emulsion layer.

20. A photographic element as claimed in claim 8 wherein said support is a poly(ethylene terephthalate) support and said image-bearing layer is an imagewise-exposed and processed gelatino/silver halide emulsion layer.

21. A photographic element as claimed in claim 8 wherein said support is a polyethylene-coated paper support and said image-bearing layer is an imagewise-exposed and processed gelatino/silver halide emulsion layer.

22. An element comprising a photographic support and a protective overcoat layer, said protective overcoat layer having been formed by (a) coating said element with a radiation-curable coating composition which forms a transparent, flexible, scratch-resistant, cross-linked polymeric layer upon radiation curing, said coating composition comprising (1) an acrylated urethane, (2) an aliphatic ethylenically-unsaturated carboxylic acid, (3) a multifunctional acrylate, and (4) a siloxy-containing polycarbinol, and (b) subjecting said coating to radiation sufficient to cure said coating and bond it to said element.

23. A method of protecting a photographic element against abrasion and scratches which comprises (a) coating at least one side of said element with a radiation-curable coating composition comprising (1) an acrylated urethane, (2) an aliphatic ethylenically-unsaturated carboxylic acid, (3) a multifunctional acrylate, and (4) a siloxy-containing polycarbinol, and (b) subjecting said coating to radiation sufficient to cure said coating and bond it to said element.

24. A method of protecting a photographic element against abrasion and scratches which comprises (a) coating both sides of said element with a radiation-curable coating composition comprising (1) an acrylated urethane, (2) an aliphatic ethylenically-unsaturated carboxylic acid, (3) a multifunctional acrylate, and (4) a siloxy-containing polycarbinol, and (b) subjecting each said coating to radiation sufficient to cure it and bond it to the side of the element on which it is coated.

25. A method as claimed in claim 23 wherein said aliphatic ethylenically-unsaturated carboxylic acid has the formula:

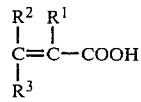

wherein $R^1$, $R^2$ and $R^3$ are independently selected from the group consisting of a hydrogen atom and an alkyl group of 1 to 3 carbon atoms.

26. A method as claimed in claim 23 wherein said aliphatic ethylenically-unsaturated carboxylic acid is acrylic acid.

27. A method as claimed in claim 23 wherein said multifunctional acrylate has the formula:

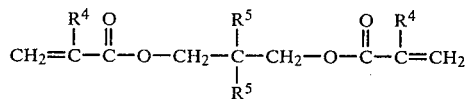

wherein each $R^4$ is independently selected from the group consisting of a hydrogen atom and an alkyl group of 1 to 2 carbon atoms, and each $R^5$ is independently selected from the group consisting of an alkyl group of 1 to 6 carbon atoms and a radical of the formula:

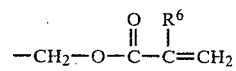

in which $R^6$ is a hydrogen atom or an alkyl group of 1 to 2 carbon atoms.

28. A method as claimed in claim 23 wherein said acrylated urethane has the formula:

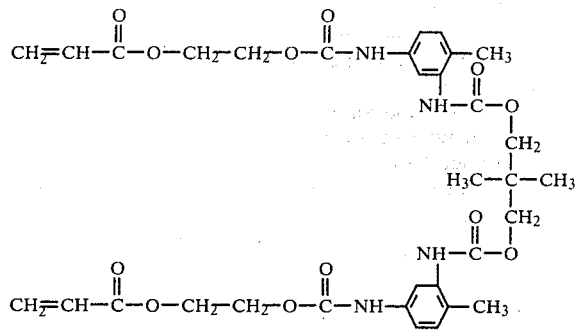

29. A method as claimed in claim 23 wherein said siloxy-containing polycarbinol has the formula:

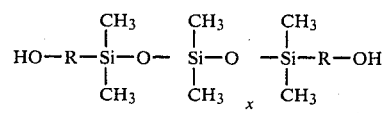

where R is a hydrocarbon radical containing 1 to 10 carbon atoms and x is an integer having a value in the range of from 2 to 100.

30. A method as claimed in claim 23 wherein said siloxy-containing polycarbinol has the formula:

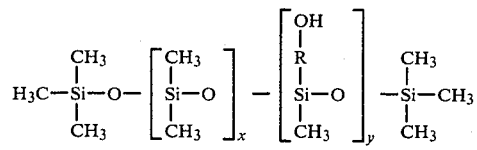

where R is a hydrocarbon radical containing 1 to 10 carbon atoms and x and y are integers having a value in the range of from 2 to 100.

31. A method of treating a photographic element comprising a support and at least one image-bearing layer, said element having defects such as scratches, abrasion marks and the like on one or both sides thereof which impair the appearance or projection capabilities of said element, which method comprises (a) applying to said element, at least in the region of said element in which said defects are located, a radiation-curable composition which fills in said defects and forms a transparent, flexible, scratch-resistant, cross-linked polymeric material upon radiation curing, said composition comprising (1) an acrylated urethane, (2) an aliphatic ethylenically-unsaturated carboxylic acid, (3) a multifunctional acrylate, and (4) a siloxy-containing polycarbinol, and (b) subjecting said composition to radiation sufficient to cure it and bond it to said element, whereby the adverse effects of said defects on the appearance or projection capabilities of said element are reduced or eliminated.

32. A method as claimed in claim 31 wherein said radiation-curable composition has a viscosity in the range of from about 10 to about 100 centipoises.

33. A method as claimed in claim 31 wherein said radiation-curable composition is applied only to the region of said element in which said defects are located.

34. A method as claimed in claim 31 wherein said radiation-curable composition covers at least one entire surface of said element.

35. A method as claimed in claim 31 wherein said support is a cellulose triacetate support and said image-bearing layer is an imagewise-exposed and processed gelatino/silver halide emulsion layer.

36. A method as claimed in claim 31 wherein said support is a poly(ethylene terephthalate) support and said image-bearing layer is an imagewise-exposed and processed gelatino/silver halide emulsion layer.

37. A method of treating a photographic motion picture film comprising a poly(ethylene terephthalate) support and at least one imagewise-exposed and processed gelatino/silver halide emulsion layer, said film having scratches in said support which impair its projection capabilities, which method comprises (a) coating said support with a radiation-curable composition which fills in said scratches and forms a transparent, flexible, scratch-resistant, cross-linked polymeric layer upon radiation curing, said composition comprising (1) an acrylated urethane, (2) an aliphatic ethylenically-unsaturated carboxylic acid, (3) a multifunctional acrylate, and (4) a siloxy-containing polycarbinol, and (b) subjecting said coating to radiation sufficient to cure it and bond it to said support, whereby the adverse effects of said scratches on the projection capabilities of said film are reduced or eliminated.

38. A method of treating a photographic motion picture film comprising a cellulose triacetate support and at least one imagewise-exposed and processed gelatino/silver halide emulsion layer, said film having scratches in said support which impair its projection capabilities, which method comprises (a) coating said support with a radiation-curable composition which fills in said scratches and forms a transparent, flexible, scratch-resistant, cross-linked polymeric layer upon radiation curing, said composition comprising (1) an acrylated urethane, (2) an aliphatic ethylenically-unsaturated carboxylic acid, (3) a multifunctional acrylate, and (4) a siloxy-containing polycarbinol, and (b) subjecting said coating to radiation sufficient to cure it and bond it to said support, whereby the adverse effects of said scratches on the projection capabilities of said film are reduced or eliminated.

* * * * *